US006617614B2

(12) United States Patent
Kurahashi et al.

(10) Patent No.: US 6,617,614 B2
(45) Date of Patent: Sep. 9, 2003

(54) SEMICONDUCTOR LIGHT-EMITTING DEVICE

(75) Inventors: Takahisa Kurahashi, Kashiba (JP); Hiroshi Nakatsu, Tenri (JP); Tetsurou Murakami, Tenri (JP); Hiroyuki Hosoba, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/943,738

(22) Filed: Sep. 4, 2001

(65) Prior Publication Data
US 2002/0028526 A1 Mar. 7, 2002

(30) Foreign Application Priority Data
Sep. 4, 2000 (JP) .................. 2000-267345

(51) Int. Cl.⁷ .................. H01L 27/15; H01L 33/00
(52) U.S. Cl. .................. 257/98; 257/79; 257/94; 257/96; 257/103; 372/96
(58) Field of Search .................. 257/14, 82, 88, 257/89, 96, 98, 99, 79, 94, 103; 372/45, 46, 50

(56) References Cited
U.S. PATENT DOCUMENTS 5,557,627 A * 9/1996 Schneider et al. .......... 372/45
5,789,768 A * 8/1998 Lee et al. .................. 257/103
5,917,201 A * 6/1999 Ming-Jiunn et al. ........ 257/103
6,259,121 B1 * 7/2001 Lemoff et al. ............... 257/14

OTHER PUBLICATIONS

K. Streubel et al.: "High Brightness Visible (660 nm) Resonant–Cavity Light–Emitting Diode" IEEE Photonics Technology Letters, vol. 10, No. 12 (1998), pp. 1685–1687.

* cited by examiner

Primary Examiner—Carl Whitehead, Jr.
Assistant Examiner—David L. Hogans
(74) Attorney, Agent, or Firm—Nixon & Vanderhye P.C.

(57) ABSTRACT

The present invention relates to a semiconductor light-emitting device used for optical transmission (particularly for IEEE 1394) and displays and the like. More specifically, an object of the present invention is to provide a semiconductor light-emitting device capable of emitting the light with a high efficiency by extending a distance from an active layer to a boundary having poor crystal quality due to Group V elements As and P exchange to suppress deterioration in crystal quality of the active layer. According to the present invention, a semiconductor light-emitting device capable of emitting the light with a high efficiency because a reflecting multilayer with a different material system from that of an active layer is formed on the substrate in order to achieve a high reflectance, however, the active layer is formed, after a reflecting multilayer formed with the same material system as that of the active layer is formed thereon, to lengthen a distance between the active layer and a material system exchange boundary.

16 Claims, 12 Drawing Sheets

(a)

(b)

(a)

(b)

(a)

(b)

(a)

(b)

(a)

(b)

(a)

(b)

SEMICONDUCTOR LIGHT-EMITTING DEVICE

BACKGROUND OF THE INVENTION

The present invention relates to a semiconductor light-emitting device used for optical transmission (particularly for IEEE 1394) and displays and the like.

Recently, semiconductor light-emitting devices are widely used in optical communication, information display panels, and the like. It is important that these semiconductor light-emitting devices have a high emission efficiency, and in the case of optical communication, they have additionally a high response speed particularly. Thus, in recent years, such devices are extensively developed.

Conventional surface-emitting type LEDs are not excellent in high-speed responsiveness. Their response speed is at fastest around 100 Mbps~200 Mbps. Therefore, semiconductor light-emitting devices designated as a resonant cavity LED or a surface-emitting laser diode have been developed. These semiconductor light-emitting devices realize a high-speed response and a high efficiency by adjusting a position of an antinode in a standing wave which is generated in a resonator defined by two mirrors so as to locate at a light-emitting layer.

More recently, it has began to use plastic optical fibers (POFs) for a relatively short distance communication and, therefor, a resonant cavity LED and a surface-emitting laser diode have been developed, in which a light-emitting layer thereof is made from an AlGaInP semiconductor material capable of emitting light with a high efficiency at 650 nm in the wavelength range of a low-loss region for the POF (High Brightness Visible (660 nm) Resonant-Cavity Light-Emitting Diode, *IEEE PHOTONICS TECHNOLOGY LETTERS*, VOL. 10. Dec. 12, 1998.)

However, since in the conventional resonant cavity LED or surface-emitting laser diode, an active layer must be made to locate precisely at the antinode of the standing wave, such devices are fabricated to have a resonator length of around a wavelength. As the result, the distance between the active layer and a distributed Bragg reflector (DBR) on the side of the substrate is very small.

When the light-emitting layer is made from an AlGaInP material, a DBR made from an AlGaAs material is used for a DBR on the substrate side which is required to have almost 100% of reflectance. This is because that an AlGaAs material provides a greater difference in a refractive index between a layer having a higher refractive index and a layer having a lower refractive index than an AlGaInP material does when a DBR is made from a material transparent to a wavelength of 650 nm.

However, in the case of a resonant cavity-type LEDs or a surface-emitting laser diode in which the distance from an active layer to a boundary where Group V elements, As and P, are exchanged (As-by-P exchange boundary) is short, there is a problem that the internal quantum efficiency deteriorates due to poor crystal quality in the As-by-P exchange boundary. The above-mentioned problem can be also said for a usual-type LED, the internal quantum efficiency thereof deteriorates when a distance between the active layer and the As-by-P exchange boundary is below a certain value.

SUMMARY OF THE INVENTION

Thus, an object of the present invention is to provide a semiconductor light-emitting device capable of emitting light with a high efficiency by extending a distance from an active layer to a boundary where crystal quality is poor due to exchange between Group V elements As and P to suppress deterioration in crystal quality of the active layer, in order to solve the problems mentioned above.

In order to attain the object of the present invention, a semiconductor light-emitting device described in claim 1 comprises a semiconductor substrate, a plurality of reflecting multilayers, and a light-emitting layer, wherein the plurality of reflecting multilayers are formed on the semiconductor substrate by using at least two material systems having a variable refractive index, and have a lattice constant similar to that of the semiconductor substrate, each of the plurality of reflecting multilayers being made from a single material system, and the light-emitting layer is formed on the plurality of reflecting multilayers, and comprises one or more layers including an active layer made from the same material system as that of the uppermost reflecting multilayer.

In the semiconductor light-emitting device according to claim 1, a high reflectance is achieved by forming a reflecting multilayer made from a different material system from that of a light-emitting layer, while decrease in the crystal quality in the active layer is avoided by forming thereon a reflecting multilayer made from the same material system as that of the light-emitting layer and, thereafter, forming the light-emitting layer to extend a distance from a material system exchange boundary to the active layer.

A semiconductor light-emitting device described in claim 2 is characterized in that a reflecting multilayer is formed on the light-emitting layer by using a material system having a lattice constant similar to that of the light-emitting layer in the semiconductor light-emitting device according to claim 1.

In the semiconductor light-emitting device according to claim 2, since the reflecting multilayer on the light-emitting layer is made from a material system having a lattice constant similar to that of the light-emitting layer, a mirror-like state can be easily obtained, and a high reflectance can be obtained with a less number of reflecting multilayers.

The semiconductor light-emitting device described in claim 3 is characterized in that the reflecting multilayer having a lattice constant similar to that of the light-emitting layer is formed on the light-emitting layer by using the same material system as that of the light-emitting layer in the semiconductor light-emitting device according to claim 2.

In the semiconductor light-emitting device according to claim 3, since the reflecting multilayer on the light-emitting layer is made from the same material system as that of the light-emitting layer, it is more easy to fabricate the semiconductor device rather than when the reflecting multilayer on the light-emitting layer has the same lattice constant as that of the light-emitting layer and is made from a different material system from that of the light-emitting layer.

The semiconductor light-emitting device described in claim 4 is characterized in that a plurality of reflecting multilayers are formed on a light-emitting layer by using at least two material systems, each of said material systems having a variable refractive index, each of the plurality of reflecting multilayers being made from a single material system, wherein the closest layer of the plurality of reflecting multilayers to the light-emitting layer is formed by using the same material system as that of the light-emitting layer in the semiconductor light-emitting device according to claim 3.

In the semiconductor light-emitting device according to claim 4, since reflecting multilayers made from a different material system from that of the light-emitting layer are provided above the light-emitting layer without directly contacting with the light-emitting layer, a reflectance of the reflecting multilayers above the light-emitting layer can be highten with a less number of the reflecting multilayers.

The semiconductor light-emitting device described in claim 5 is characterized in that one layer constituting a reflecting multilayer in contact with the light-emitting layer has a greater energy gap than another layer consitituting the reflecting multilayer does in the semiconductor light-emitting device according to any one of claims 1 to 4.

In the semiconductor light-emitting device according to claim 5, since the layer formed by using the material having a greater energy gap contacts the light-emitting layer, overflow of carrier can be suppressed.

The semiconductor light-emitting device described in claim 6 is characterized in that the semiconductor substrate is made from GaAs in the semiconductor light-emitting device according to any one of claims 1 to 5.

In the semiconductor light-emitting device according to claim 6, material systems having lattice matching with that of the GaAs substrate, such as AlGaAs, AlGaInP, ZnSe, and the like may be used.

The semiconductor light-emitting device described in claim 7 is characterized in that the plurality of reflecting multilayers, each being made from a single material system, which have a lattice constant similar to that of the semiconductor substrate, and are formed on the semiconductor substrate by using at least two material systems having a variable refractive index, comprise $(Al_yGa_{1-y})_zIn_{1-z}P$ ($0 \leq y \leq 1$, $0 \leq z \leq 1$); and the light-emitting layer comprises $(Al_{y'}Ga_{1-y'})_{z'}In_{1-z'}P$ ($0 \leq y' \leq 1$, $0 \leq z' \leq 1$) in the semiconductor light-emitting device according to claim 6.

In the semiconductor light-emitting device according to claim 7, light with a wavelength ranging from red to green may be emitted by using an AlGaInP material system for the light-emitting layer and a reflecting multilayer contacting the light-emitting layer, and by varying arbitrarily the parameter sets, y and z, as well as, y' and z'.

The semiconductor light-emitting device described in claim 8 is characterized in that the plurality of reflecting multilayers, each being made from a single material system, which have a lattice constant similar to that of the semiconductor substrate, and are formed on the semiconductor substrate by using at least two material systems having a variable refractive index, comprise $Al_xGa_{1-x}As$ ($0 \leq x \leq 1$) in the semiconductor light-emitting device according to claim 7.

In the semiconductor light-emitting device according to claim 8, since the reflecting multilayer made from $Al_xGa_{1-x}As$ ($0 \leq x \leq 1$) shows a higher reflectance to the light in a wavelength ranging from red to green than the reflecting multilayer made from $(Al_yGa_{1-y})_zIn_{1-z}P$ ($0 \leq y \leq 1$, $0 \leq z \leq 1$) does, a higher reflectance can be obtained with a less number of layers.

The semiconductor light-emitting device described in claim 9 is characterized in that the plurality of reflecting multilayers, each being made from a single material system, which have a lattice constant similar to that of the light-emitting layer, and are formed on the light-emitting layer by using at least two material systems having a variable refractive index, comprise $Al_yGa_{1-x}As$ ($0 \leq x \leq 1$) in the semiconductor light-emitting device according to claim 8.

In the semiconductor light-emitting device according to claim 9, since the reflecting multilayer made from $Al_xGa_{1-x}As$ ($0 \leq x \leq 1$) shows a higher reflectance to the light in a wavelength ranging from red to green than the reflecting multilayer made from $(Al_yGa_{1-y})_zIn_{1-z}P$ ($0 \leq y \leq 1$, $0 \leq z \leq 1$) does, a higher reflectance can be obtained with a less number of layers.

The semiconductor light-emitting device described in claim 10 is characterized in that, in the semiconductor light-emitting device according to any one of claims 1 to 9, a distance from a boundary to the active layer is 0.3 μm or longer, said boundary being between a reflecting multilayer made form the same material system as that of the uppermost reflecting multilayer of the plurality of reflecting multilayers, each being made from a single material system, which have a lattice constant similar to that of the semiconductor substrate, and are formed on the semiconductor substrate by using at least two material systems having a variable refractive index, and a reflecting multilayer provided below said reflecting multilayer and made from another material system.

In the semiconductor light-emitting device according to claim 10, since a distance from the active layer to the boundary between a reflecting multilayer made form the same material system as that of the uppermost reflecting multilayer and a reflecting multilayer made from another material system is 0.3 μm or longer, an active layer having a high crystal quality can be formed.

The semiconductor light-emitting device described in claim 11 is characterized in that the active layer is a quantum-well layer in the semiconductor light-emitting device according to any one of claims 1 to 10.

In the semiconductor light-emitting device according to claim 11, since the active layer is a quantum-well, this light-emitting device can be applied to resonant-cavity LEDs, surface-emitting laser diodes, and the like, having a quantum-well active layer, to manufacture a high-efficient semiconductor light-emitting device.

DETAILED DESCRIPTION OF THE INVENTION

Figure 1:
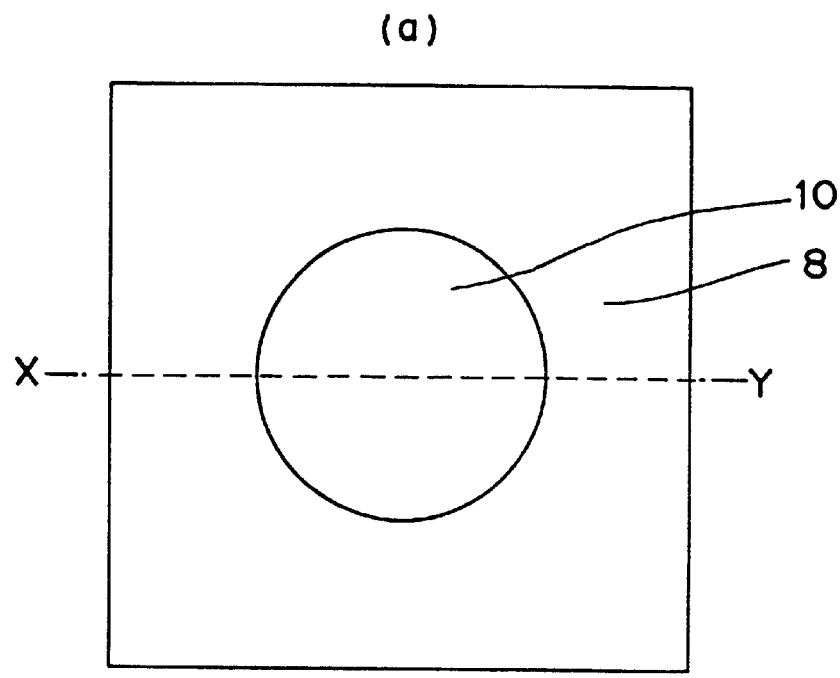
FIGS. 1(a) and (b) show a plan view of the semiconductor light-emitting device according to Example 1 of the present invention and its cross-sectional view cut along an X-Y line, respectively.
Figure 1:
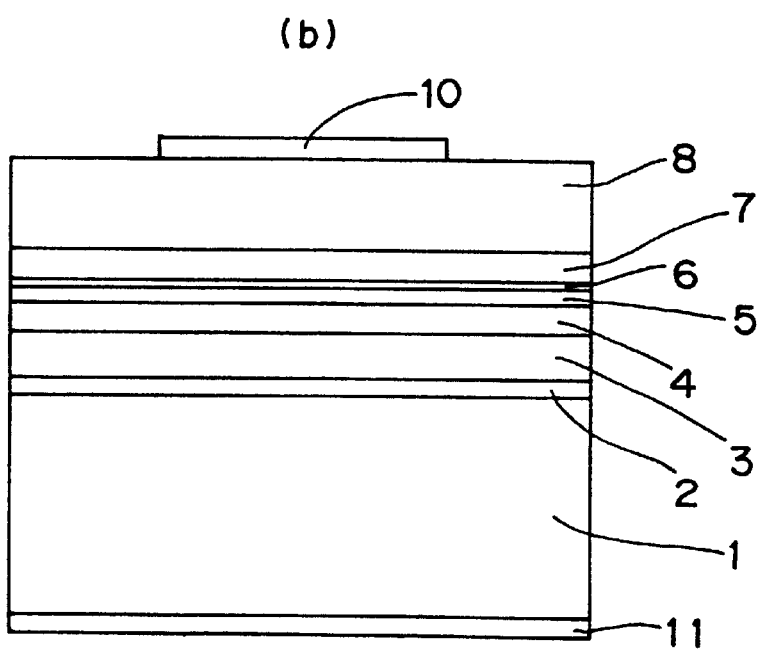

Hereinafter, the present invention will be described in details based on Examples illustrated in the drawings.

In Examples of the present invention, a DBR is constituted by depositing alternatively two-types of layers multiple times. That is, for example, in a DBR constituted with Layer a and Layer b, there are two types of constitutions as follows:

ab/ab/ . . . ab: all layers pair off;

ab/ab/ . . . /ab/a: only the last layer does not pair off.

The pair number of the former constitution is represented by an integer, such as 10, on the other hand, that of the latter constitution is represented by, for example, 10.5.

EXAMPLE 1

FIG. 1(a) shows a plan view of a semiconductor light-emitting device obtained in this Example, and FIG. 1(b) shows a cross-sectional view of the device cut along an X-Y line in FIG. 1(a). FIG. 2 is a cross-sectional view showing a process for manufacturing the semiconductor light-emitting device according to this Example. FIG. 3(a) is a plan view showing a process for manufacturing the semiconductor light-emitting device according to this Example, and FIG. 3(b) is a cross-sectional view showing the device cut along an X-Y line in FIG. 3(a).

This semiconductor light-emitting device is a device of an AlGaInP system, wherein, as shown in FIG. 2, on an n-type GaAs substrate 1 are deposited successively an n-type GaAs buffer layer 2 (thickness 1 μm), a DBR 3 which consists of 20.5 pairs of an n-type $Al_{0.5}Ga_{0.5}As$ and an n-type AlAs, a DBR 4 which consists of 5 pairs of an n-type $Al_{0.5}In_{0.5}P$ and an n-type $(Al_{0.2}Ga_{0.8})_{0.5}In_{0.5}P$, an n-type $(Al_{0.7}Ga_{0.3})_{0.5}In_{0.5}P$ first cladding layer 5 (thickness about 0.2 μm), a quantum-well active layer 6 which consists of an 80-Å GaInP well layer and two 200-Å $(Al_{0.5}Ga_{0.5})_{0.5}In_{0.5}P$ barrier layers formed on the both sides of the 80-Å GaInP well layer, a p-type $(Al_{0.7}Ga_{0.3})_{0.5}In_{0.5}P$ second cladding layer 7 (thickness about 1 μm), a p-type $Al_{0.5}Ga_{0.5}As$ current diffusing layer 8 (thickness 7 μm), and a p-type GaAs cap layer 9 (thickness 0.01 μm) by a Metal Organic Chemical Vapor Deposition (MOCDV) method.

Here, the DBR 3 consisting of 20.5 pairs of an n-type $Al_{0.5}Ga_{0.5}As$ and an n-type AlAs and the DBR 4 consisting of 5 pairs of an n-type $Al_{0.5}In_{0.5}P$ and an n-type $(Al_{0.2}Ga_{0.8})_{0.5}In_{0.5}P$ were designed so that the center of the reflection spectrum was at 650 nm. In addition, the quantum-well active layer 6 was designed so that a wavelength at a peak was 650 nm. Further, the thickness of the n-type $(Al_{0.7}Ga_{0.3})_{0.5}In_{0.5}P$ first cladding layer 5 was adjusted so that an interference peak caused by a reflection light with DBRs and the emitted light from the active layer was at 650 nm.

Figure 3:
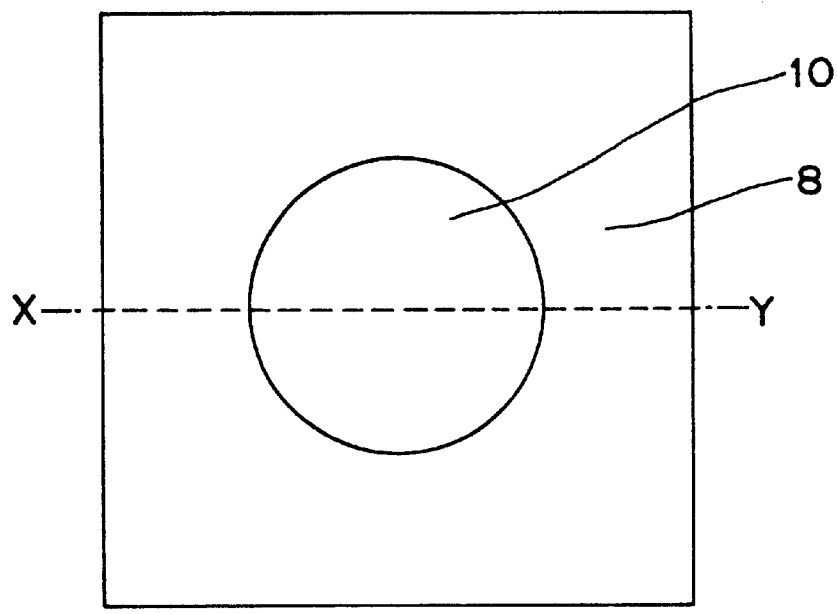
FIGS. 3(a) and (b) are a plan view showing a process for manufacturing the semiconductor light-emitting device in FIG. 1 and its cross-sectional view cut along an X-Y line, respectively.
Figure 3:
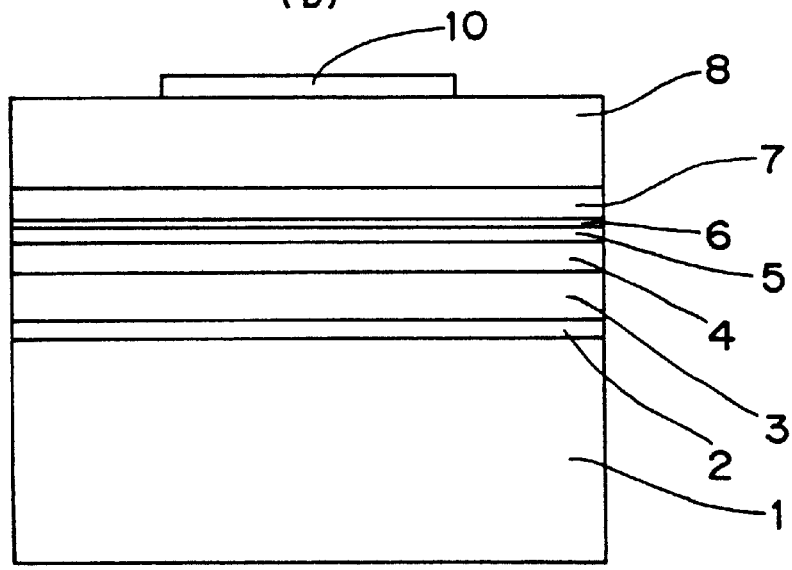

Thereafter, as shown in FIG. 3, an n-type GaAs cap layer 9 was removed with a sulfuric acid/hydrogen peroxide etchant, subsequently, AuZn/Mo/Au was sputtered on the p-type $Al_{0.5}Ga_{0.5}As$ current diffusing layer 8 and, then, patterned by photolithography to form a surface electrode. After that, a p-type electrode 10 was obtained by heat-treatment.

Figure 2:
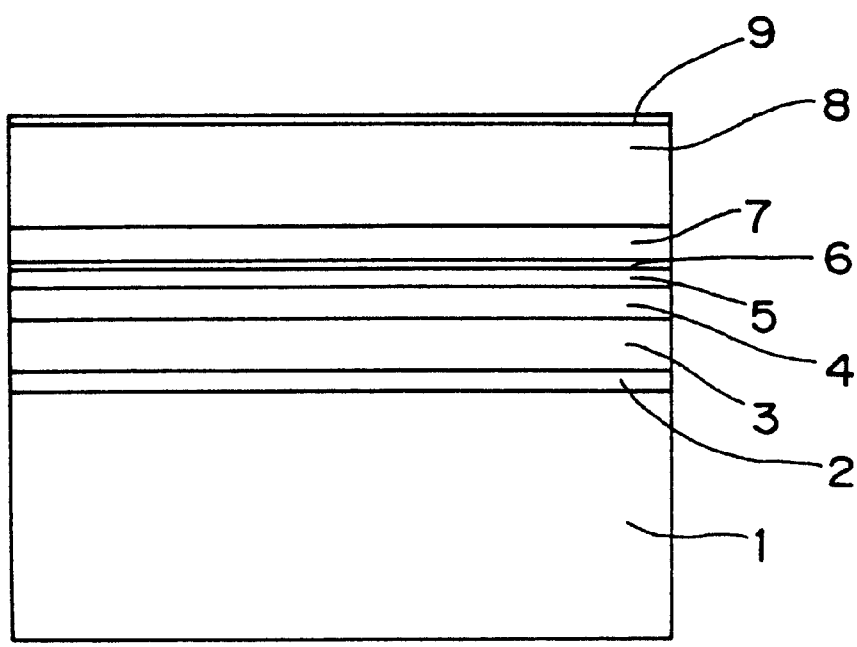
FIG. 2 is a cross-sectional view showing a process for manufacturing the semiconductor light-emitting device in FIG. 1.

Then, as shown in FIG. 1, the GaAs substrate was ground to about 280 μm and, an n-type electrode 11 was formed by depositing AuGe/Au on the ground surface and heat-treating it. The power of light emitted from the semiconductor light-emitting device thus obtained was 1.45 mW at 30 mA. The power of light was enhanced to about triple comparing to a device without the DBR 4 consisting of 5 pairs of an n-type $Al_{0.5}In_{0.5}P$ and an n-type $(Al_{0.2}Ga_{0.8})_{0.5}In_{0.5}P$ wherein the power of light was 0.44 mW at 30 mA. Since the reflectance of the DBR 3 consisting of 20.5 pairs of an n-type $Al_{0.5}Ga_{0.5}As$ and an n-type AlAs is over 90%, it is understood that the triple power of light is caused slightly by the reflectance improvement due to the addition of the DBR 4 consisting of 5 pairs of an n-type $Al_{0.5}In_{0.5}P$ and an n-type $(Al_{0.2}Ga_{0.8})_{0.5}In_{0.5}P$, and largely by crystal quality improvement in the active layer due to the lengthening of a distance from the As-by-P exchange boundary to the active layer.

Figure 4:
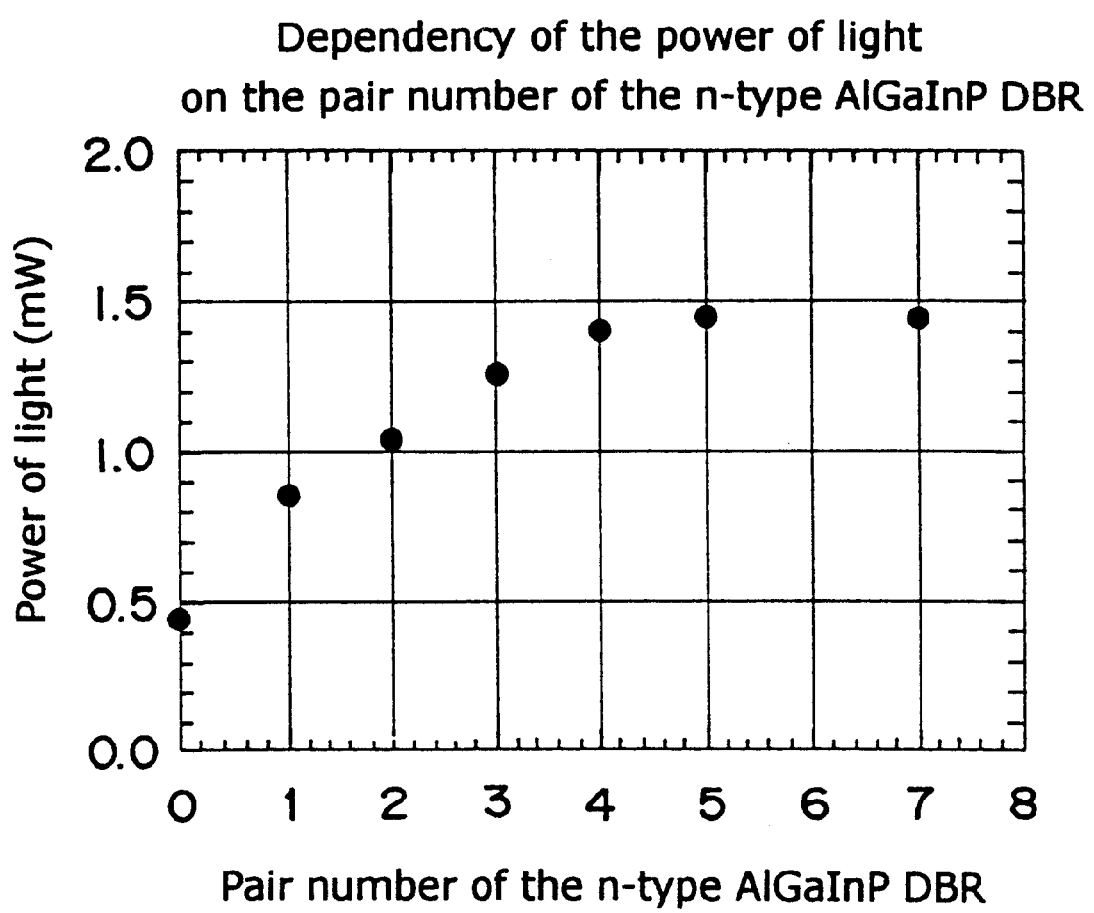
FIG. 4 is a graphic representation indicating the dependency of the power of light on the pair number of the n-type AlGaInP DBR.

The dependency of the power of light on the pair number of a DBR consisting of an n-type $Al_{0.5}In_{0.5}P$ and an n-type $(Al_{0.2}Ga_{0.8})_{0.5}In_{0.5}P$ is shown in FIG. 4, when the thickness of the n-type $(Al_{0.7}Ga_{0.3})_{0.5}In_{0.5}P$ first cladding layer was about 0.2 μm.

From FIG. 4, it is understood that a distance from the boundary between an AlGaAs DBR and an AlGaInP DBR to an active layer is required to be 0.3 μm or longer in order to suppress the reduction in the power of light within one-half because the thickness of one pair is about 0.1 μm.

EXAMPLE 2

FIG. 5(a) shows a plan view of a semiconductor light-emitting device obtained in this Example, and FIG. 5(b) shows a cross-sectional view of the device cut along an X-Y line in FIG. 5(a). FIG. 6 is a cross-sectional view showing a process for manufacturing the semiconductor light-emitting device according to this Example. FIG. 7(a) and FIG. 8(a) are, respectively, plan views showing a process for manufacturing the semiconductor light-emitting device according to this Example, and FIG. 7(b) and FIG. 8(b) show cross-sectional views of the device cut along X-Y lines in FIG. 7(a) and FIG. 8(a), respectively.

This semiconductor light-emitting device is a device of an AlGaInP system, wherein, as shown in FIG. 6, on an n-type GaAs substrate 21 are deposited successively an n-type GaAs buffer layer 22 (thickness 1 μm), a DBR 23 which consists of 30.5 pairs of an n-type $Al_{0.5}Ga_{0.5}As$ and an n-type AlAs, a DBR 24 which consists of 5.5 pairs of an n-type $Al_{0.5}In_{0.5}P$ and an n-type $(Al_{0.2}Ga_{0.8})_{0.5}In_{0.5}P$, an n-type $(Al_{0.7}Ga_{0.3})_{0.5}In_{0.5}P$ first cladding layer 25, a quantum-well active layer 26 which consists of a 50-Å GaInP well layer, a p-type $(Al_{0.7}Ga_{0.3})_{0.5}In_{0.5}P$ second cladding layer 27, a DBR 28 which consists of 12.5 pairs of an p-type $Al_{0.05}In_{0.5}P$ and an p-type $(Al_{0.2}Ga_{0.8})_{0.5}In_{0.5}P$, a p-type AlGaInP middle layer 29 (thickness 0.15 μm), a p-type $Al_{0.01}Ga_{0.98}In_{0.01}P$ first current diffusing layer 30 (thickness 1 μm), an n-type $Al_{0.01}Ga_{0.98}In_{0.01}P$ current constriction layer 31 (thickness 0.3 μm), and an n-type GaAs cap layer 32 (thickness 0.01 μm) by MOCDV.

Here, the DBR 23 consisting of 30.5 pairs of an n-type $Al_{0.5}Ga_{0.5}As$ and an n-type AlAs, the DBR 24 consisting of 5.5 pairs of an n-type $Al_{0.5}In_{0.5}P$ an n-type $(Al_{0.2}Ga_{0.8})_{0.5}In_{0.5}P$ and the DBR 28 consisting of 12.5 pairs of a p-type $Al_{0.5}In_{0.5}P$ and a p-type $(Al_{0.2}Ga_{0.8})_{0.5}In_{0.5}P$ were designed so that the center of the reflection spectrum was at 665 nm. In addition, the length of a cavity defined by DBR 24 and DBR 28 was adjusted so that the resonant wavelength in the cavity became 665 nm. In this example, the length of the cavity was set to be twice the wavelength. Further, the quantum-well active layer 26 was positioned at the antinode of the standing wave generated in the cavity so that the wavelength at the peak of the emitted light became 665 nm.

Figure 7:
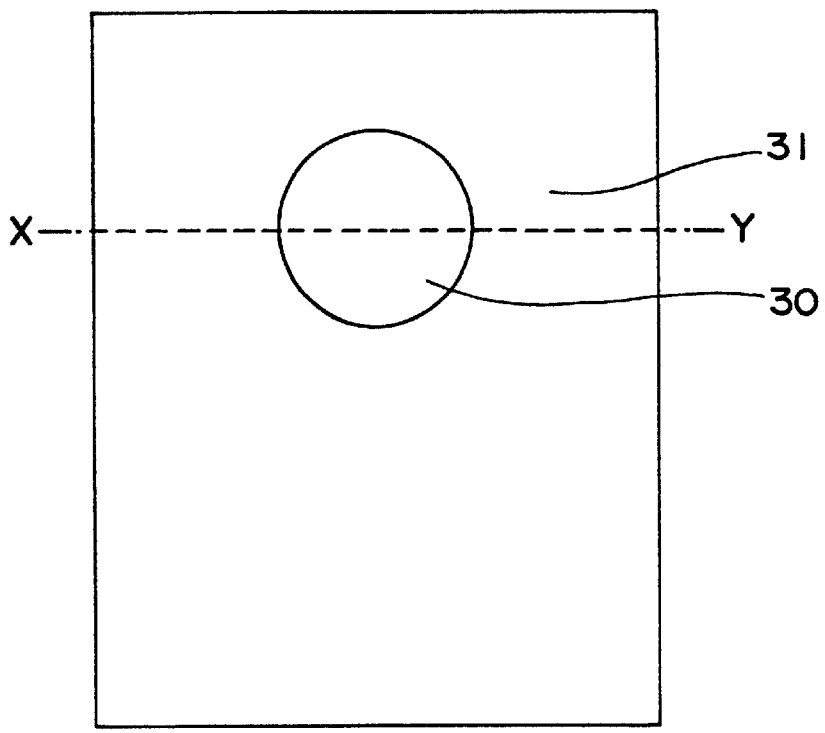
FIGS. 7(a) and (b) are a plan view showing a process for manufacturing the semiconductor light-emitting device in FIG. 5 and its cross-sectional view cut along an X-Y line, respectively.
Figure 7:
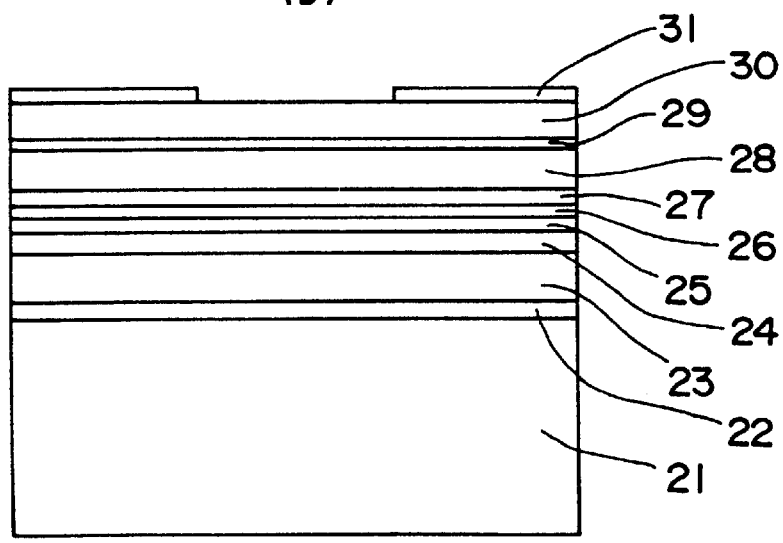

Thereafter, as shown in FIG. 7, an n-type GaAs cap layer 32 was removed with a sulfuric acid/hydrogen peroxide etchant, the n-type $Al_{0.01}Ga_{0.98}In_{0.01}P$ current constriction layer 31 was etched by photolithography and using a sulfuric acid/hydrogen peroxide etchant up to the p-type $Al_{0.01}Ga_{0.98}In_{0.01}P$ first current diffusing layer 30. This etching formed a 70-$\mu$m$\phi$ circular current path.

Figure 8:
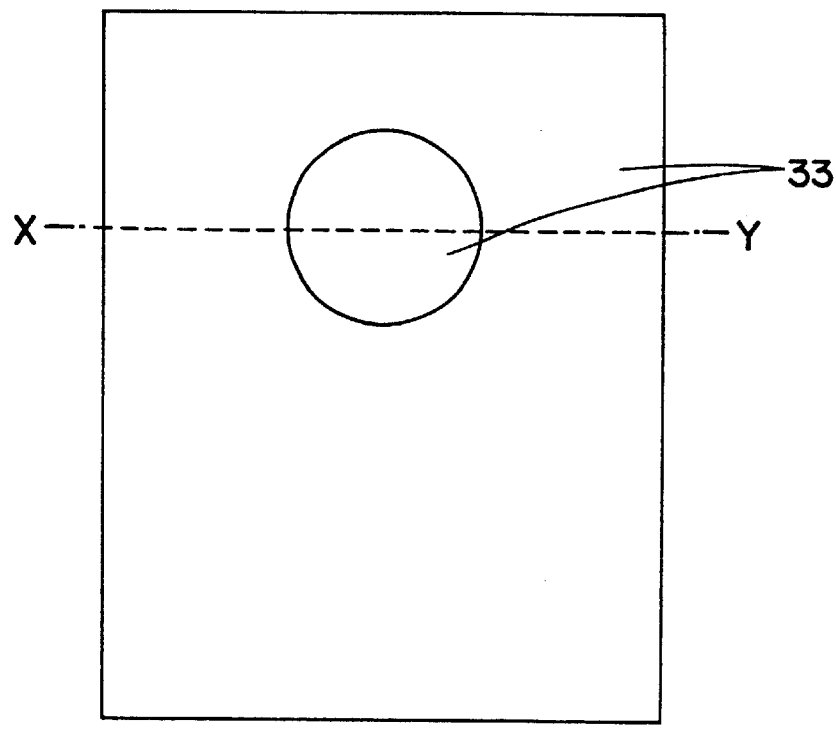
FIGS. 8(a) and (b) are a plan view showing a process for manufacturing the semiconductor light-emitting device in FIG. 5 and its cross-sectional view cut along an X-Y line, respectively.
Figure 8:
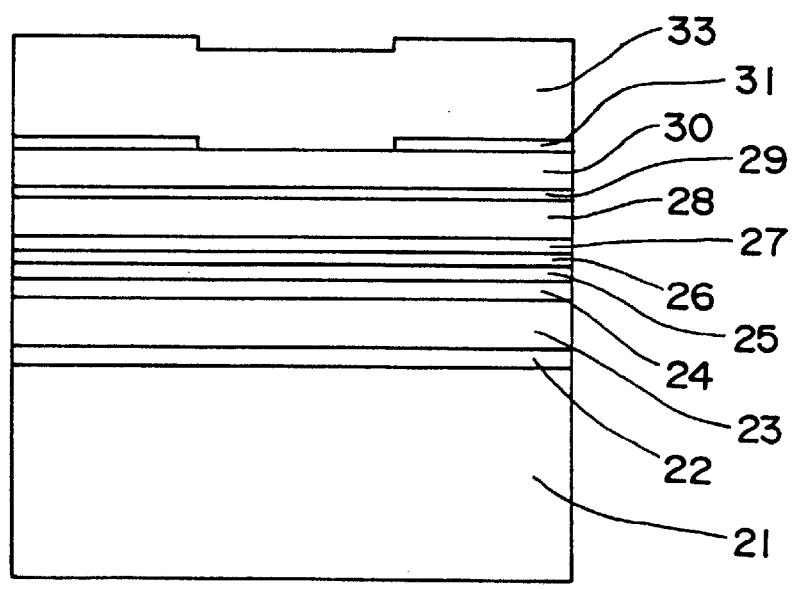

Subsequently, as shown in FIG. 8, a p-type $Al_{0.01}Ga_{0.98}In_{0.01}P$ second current diffusing layer 33 (thickness 7 $\mu$m) was re-grown on the n-type $Al_{0.01}Ga_{0.98}In_{0.01}P$ current constriction layer 31 and the p-type $Al_{0.01}Ga_{0.98}In_{0.01}P$ first current diffusing layer 30.

Figure 5:
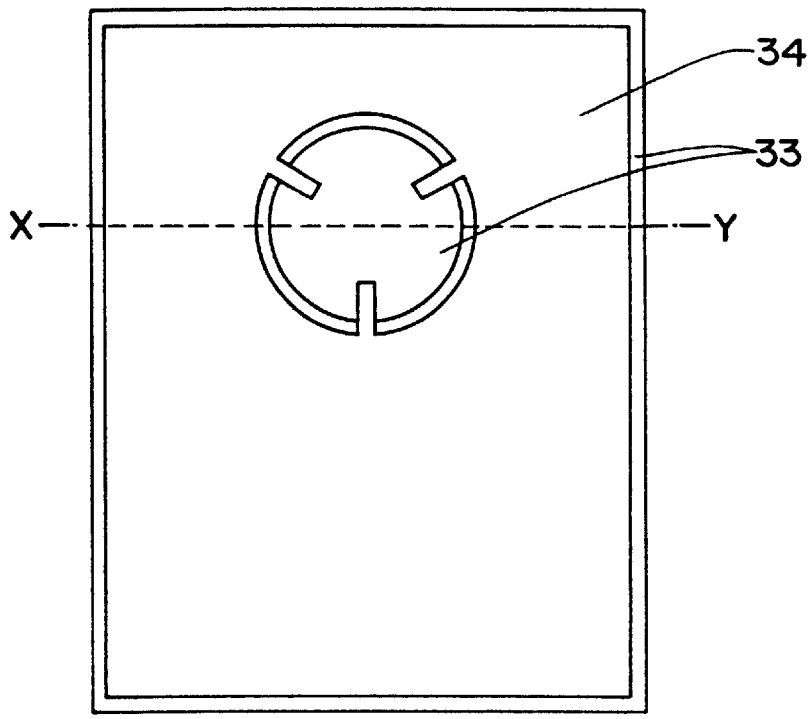
FIGS. 5(a) and (b) show a plan view of the semiconductor light-emitting device according to Example 2 of the present invention and its cross-sectional view cut along an X-Y line, respectively.
Figure 5:
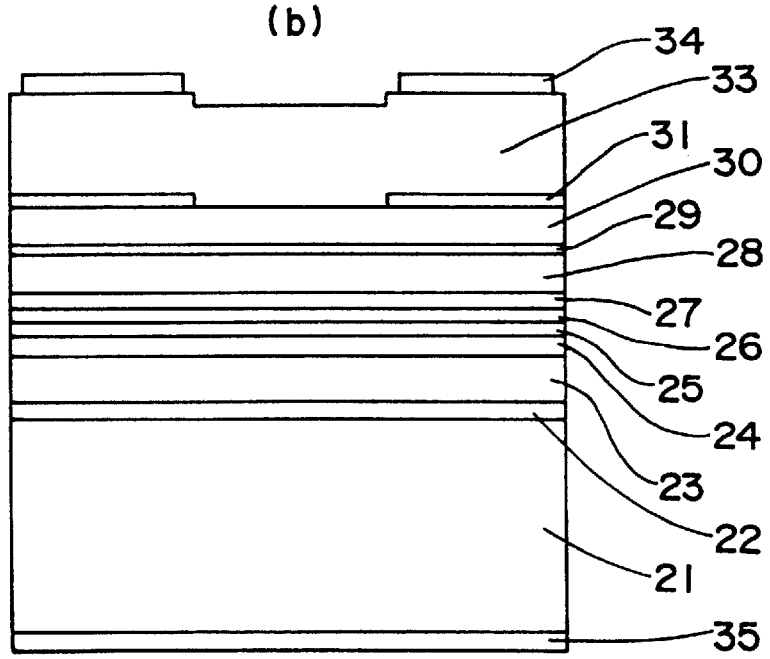
Figure 6:
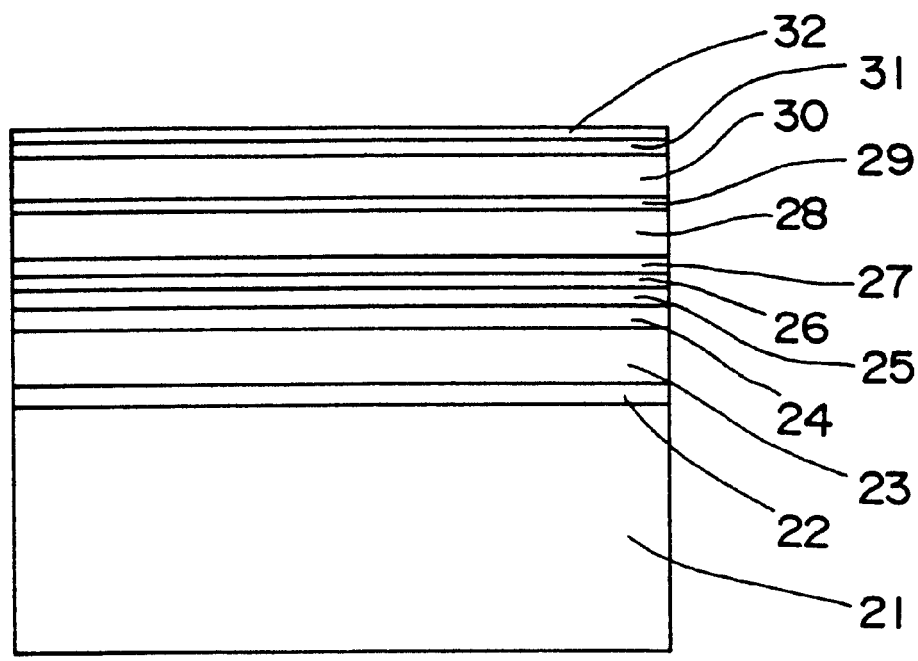
FIG. 6 is a cross-sectional view showing a process for manufacturing the semiconductor light-emitting device in FIG. 5.

Then, as shown in FIG. 5, a surface electrode was formed on the p-type $Al_{0.01}Ga_{0.98}In_{0.01}P$ second current diffusing layer 33 by depositing AuBe/Au followed by etching it by photolithography and using an Au etchant. After that, a p-type electrode 34 was obtained by heat-treatment. Then, the GaAs substrate was ground to about 280 $\mu$m and, an n-type electrode 35 was formed by depositing AuGe/Au and heat-treating it.

The power of light emitted from the semiconductor light-emitting device thus obtained was 3.5 mW at 30 mA. The power of light was enhanced to about twice comparing to a device without DBR 24 consisting of 5.5 pairs of an n-type $Al_{0.5}In_{0.5}P$ and an n-type $(Al_{0.2}Ga_{0.8})_{0.5}In_{0.5}P$, wherein the power of light was 1.8 mW at 30 mA.

In this Example, the power of the light was enhanced to about twice because the thickness of the n-type $(Al_{0.7}Ga_{0.3})_{0.5}In_{0.5}P$ first cladding layer 25 was about 0.3 $\mu$m. Since the reflectance of the DBR 23 consisting of 30.5 pairs of an n-type $Al_{0.5}Ga_{0.5}As$ and an n-type AlAs is about 98%, it is understood that the twice power of light is caused slightly by the reflectance improvement due to the addition of the DBR 24 consisting of 5.5 pairs of an n-type $Al_{0.5}In_{0.5}P$ and $(Al_{0.2}Ga_{0.8})_{0.5}In_{0.5}P$, and largely by crystal quality improvement in the active layer due to the lengthening of the distance from the As-by-P exchange boundary to the active layer.

In addition, the ability to confine carriers was improved by making a DBR layer contacting with the active layer by using $Al_{0.5}In_{0.5}P$ having a greater energy gap and, the power of the light was enhanced 4–6% comparing to the case where a DBR layer contacting the active layer was made by using $(Al_{0.2}Ga_{0.8})_{0.5}In_{0.5}P$.

EXAMPLE 3

FIG. 9(a) shows a plan view of a semiconductor light-emitting device obtained in this Example, and FIG. 9(b) shows a cross-sectional view of the device cut along an X-Y line in FIG. 9(a). FIG. 10 is a cross-sectional view showing a process for manufacturing the semiconductor light-emitting device according to this Example. FIG. 11(a) and FIG. 12(a) are, respectively, plan views showing a process for manufacturing the semiconductor light-emitting device according to this Example, and FIG. 11(b) and FIG. 12(b) show cross-sectional views of the device cut along X-Y lines in FIG. 11(a) and FIG. 12(a), respectively.

This semiconductor light-emitting device is a device of an AlGaInP system, wherein, as shown in FIG. 10, on an n-type GaAs substrate 41 are deposited successively an n-type GaAs buffer layer 42 (thickness 1 $\mu$m), a DBR 43 which consists of 55.5 pairs of an n-type $Al_{0.5}Ga_{0.5}As$ and an n-type AlAs, a DBR 44 which consists of 5.5 pairs of an n-type $Al_{0.5}In_{0.5}P$ and an n-type $(Al_{0.2}Ga_{0.8})_{0.5}In_{0.5}P$, an n-type $(Al_{0.7}Ga_{0.3})_{0.5}In_{0.5}P$ first cladding layer 45, a quantum-well active layer 46 which consists of a 50-Å GaInP well layer, a p-type $(Al_{0.7}Ga_{0.3})_{0.5}In_{0.5}P$ second cladding layer 47, a DBR 48 which consists of 5.5 pairs of an p-type $Al_{0.5}In_{0.5}P$ and an p-type $(Al_{0.2}Ga_{0.8})_{0.5}In_{0.5}P$, a DBR 49 which consists of 10.5 pairs of an p-type $Al_{0.5}Ga_{0.5}As$ and an p-type AlAs, a DBR 50 which consists of 1.5 pairs of an p-type $Al_{0.5}In_{0.5}P$ and an p-type $(Al_{0.2}Ga_{0.8})_{0.5}In_{0.5}P$, a p-type AlGaInP middle layer 51 (thickness 0.15 $\mu$m), a p-type $Al_{0.01}Ga_{0.99}In_{0.01}P$ first current diffusing layer 52 (thickness 1 $\mu$m), an n-type $Al_{0.01}Ga_{0.98}In_{0.01}P$ current constriction layer 53 (thickness 0.3 $\mu$m), and an n-type GaAs cap layer 54 (thickness 0.01 $\mu$m) by MOCDV.

Here, the DBR 43 consisting of 55.5 pairs of an n-type $Al_{0.5}Ga_{0.5}As$ and an n-type AlAs, the DBR 44 consisting of 5.5 pairs of an n-type $Al_{0.5}In_{0.5}P$, the DBR 48 consisting of 5.5 pairs of an p-type $Al_{0.5}In_{0.5}P$ and an p-type $(Al_{0.2}Ga_{0.8})_{0.5}In_{0.5}P$, the DBR 49 consisting of 10.5 pairs of an p-type $Al_{0.5}Ga_{0.5}As$ and an p-type AlAs, and the DBR 50 consisting of 1.5 pairs of an p-type $Al_{0.5}In_{0.5}P$ and an p-type $(Al_{0.2}Ga_{0.8})_{0.5}In_{0.5}P$ were designed so that the center of the reflection spectrum was at 665 nm. In addition, the closest layers in the DBR 44 consisting of 5.5 pairs of an n-type $Al_{0.5}In_{0.5}P$ and the DBR 48 consisting of 5.5 pairs of an p-type $Al_{0.5}In_{0.5}P$ and an p-type $(Al_{0.2}Ga_{0.8})_{0.5}In_{0.5}P$ to the GaInP quantum-well active layer 46 were made by using $Al_{0.5}In_{0.5}P$. Further, the length of a cavity defined by the DBR 44 and the DBR 48 was adjusted so that the resonant wavelength in the cavity became 665 nm. In this Example, the length of the cavity was set to be twice the wavelength. In addition, the quantum-well active layer 46 was positioned at the antinode of the standing wave generated in the cavity so that the wavelength at the peak of the emitted light became 665 nm.

Figure 11:
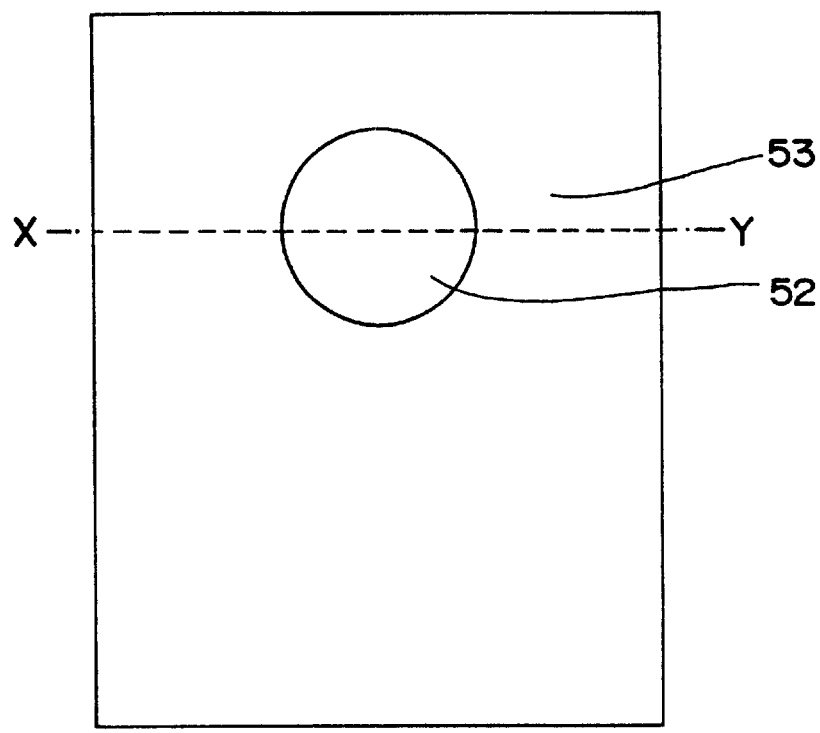
FIGS. 11(a) and (b) are a plan view showing a process for manufacturing the semiconductor light-emitting device in FIG. 9 and its cross-sectional view cut along an X-Y line, respectively.
Figure 11:
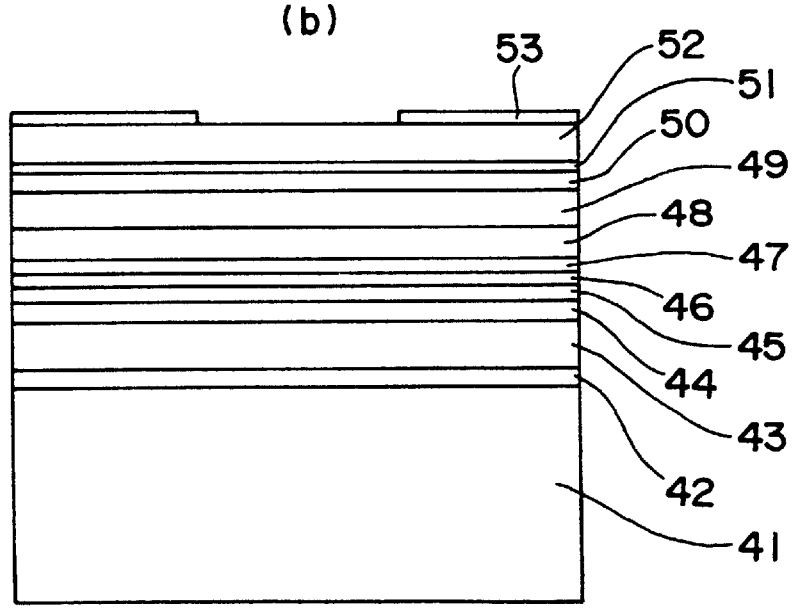

Thereafter, as shown in FIG. 11, an n-type GaAs cap layer 54 was removed with a sulfuric acid/hydrogen peroxide etchant, and the n-type $Al_{0.01}Ga_{0.98}In_{0.01}P$ current constriction layer 53 was etched by photolithography and using a sulfuric acid/hydrogen peroxide etchant up to the p-type $Al_{0.01}Ga_{0.98}In_{0.01}P$ first current diffusing layer 52. This etching formed a 70-$\mu$m$\phi$ circular current path.

Figure 12:
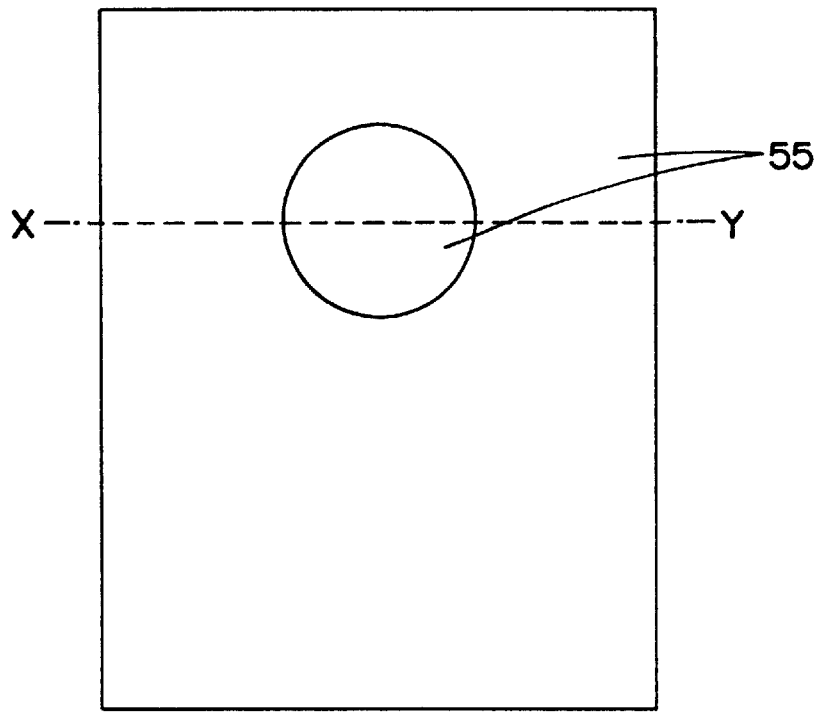
FIGS. 12(a) and (b) are a plan view showing a process for manufacturing the semiconductor light-emitting device in FIG. 9 and its cross-sectional view cut along an X-Y line, respectively.
Figure 12:
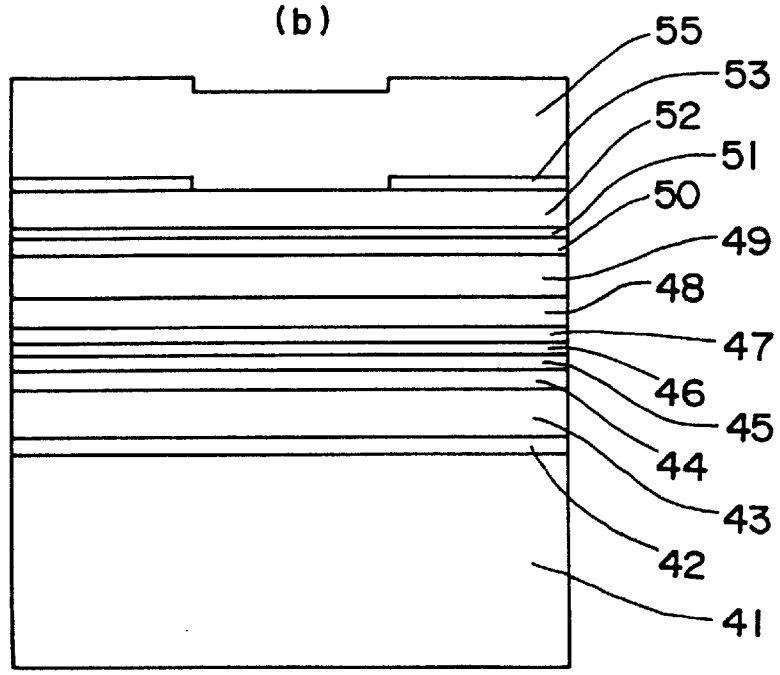

Subsequently, as shown in FIG. 12, a p-type $Al_{0.01}Ga_{0.98}In_{0.01}P$ second current diffusing layer 55 (thickness 7 $\mu$m) was re-grown on the n-type $Al_{0.01}Ga_{0.98}In_{0.01}P$ current constriction layer 53 and the p-type $Al_{0.01}Ga_{0.98}In_{0.01}P$ first current diffusing layer 52.

Figure 9:
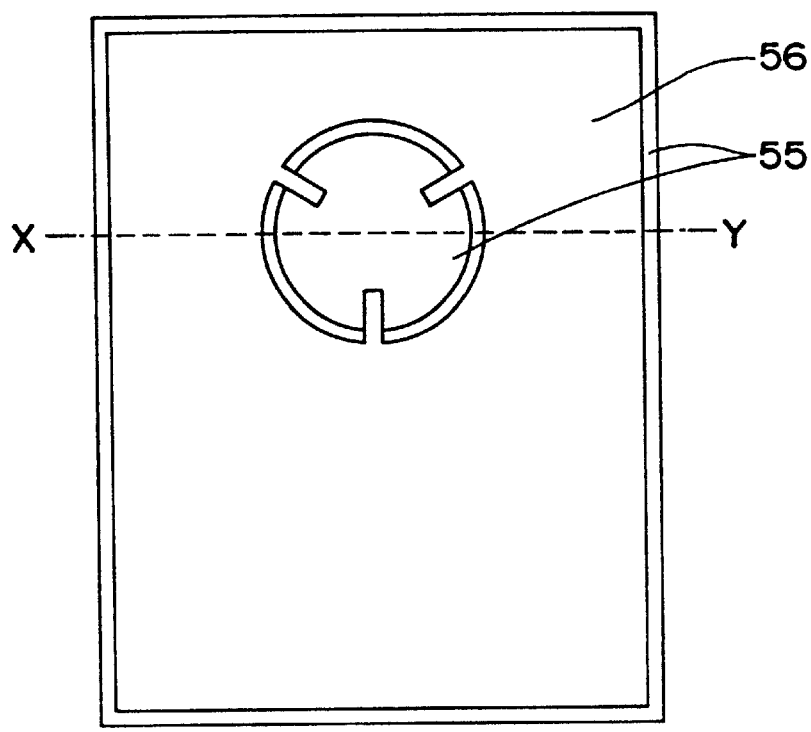
FIGS. 9(a) and (b) show a plan view of the semiconductor light-emitting device according to Example 3 of the present invention and its cross-sectional view cut along an X-Y line, respectively.
Figure 9:
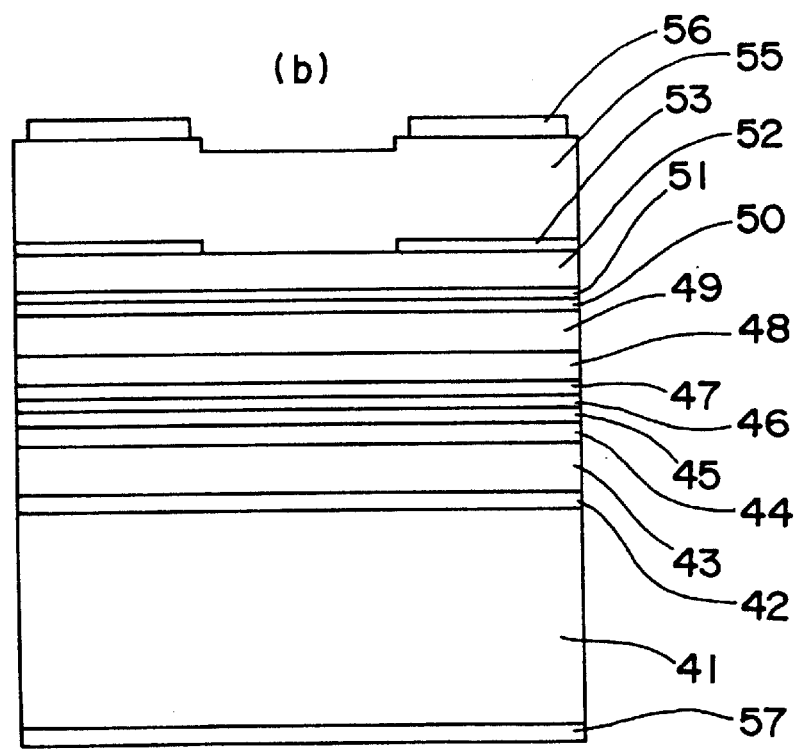
Figure 10:
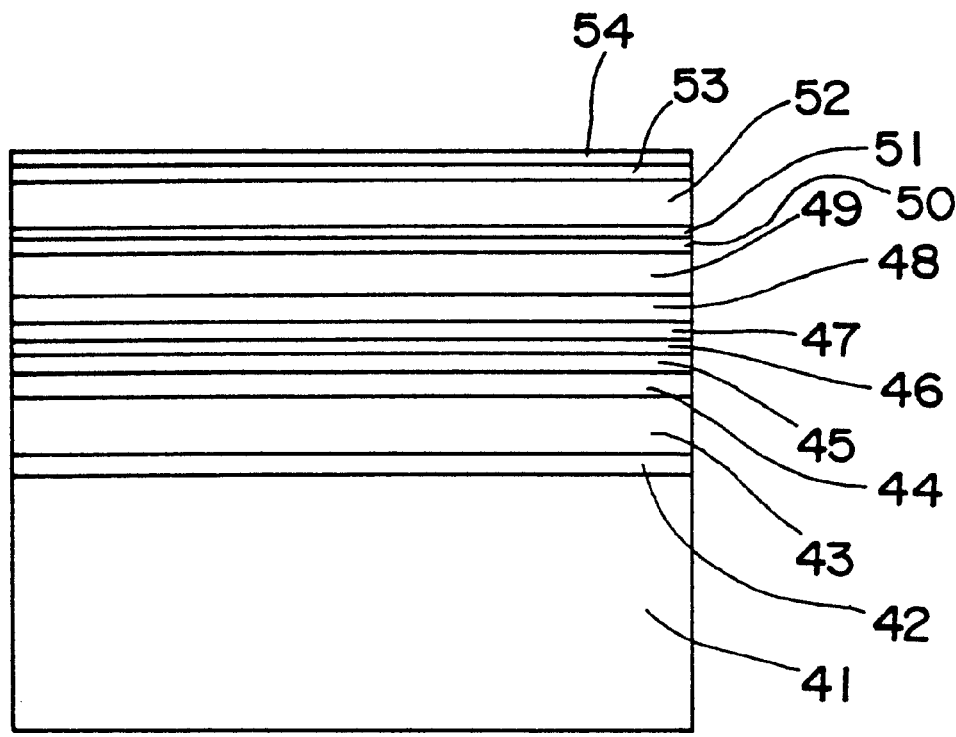
FIG. 10 is a cross-sectional view showing a process for manufacturing the semiconductor light-emitting device in FIG. 9.

Then, as shown in FIG. 9, a surface electrode was formed on the p-type $Al_{0.01}Ga_{0.98}In_{0.01}P$ second current diffusing layer 55 by depositing AuBe/Au followed by etching it by photolithography and using an Au etchant. After that, a p-type electrode 56 was obtained by heat-treatment. Then, the GaAs substrate was ground to about 280 $\mu$m and, an n-type electrode 57 was formed by depositing AuGe/Au and heat-treating it.

In the semiconductor light-emitting device thus obtained, the reflectances of the reflecting multilayers on the both sides of the light-emitting layer were enhanced comparing to those in the semiconductor light-emitting device obtained in Example 2. That is, the reflectance of the reflecting multilayers on the substrate side of the light-emitting layer was 98–99% (a total of the reflectance of the DBR 23 and that of the DBR 24) in Example 2, while it was over 99% (a total of the reflectance of the DBR 43 and that of the DBR 44) in this Example. In addition, the reflectance of the reflecting multilayers on the opposite side of the light-emitting layer to the substrate was 70% (DBR 28) in Example 2, while it was about 95% (a total the refrectance of the DBR 48, that of the DBR 49 and that of the DBR 50). Therefore, the half-width of the emitted light became about a half in this Example. This means that the semiconductor light-emitting device according to this Example is more suitable for a light source in communication via an optical fiber. When an AlGaInP material is used for DBRs above the light-emitting layer, more than twenty pairs of layers are required in order to obtain a reflectance over 90%, resulting in a narrow half-width of the reflection spectrum of 20–30 nm. In this Example, a high reflectance and a broad reflection spectrum width were obtained with a less number of layers by inserting an AlGaAs DBR in the midst of AlGaInP DBRs. The power of the light similar to that in Example 2 was obtained.

In this Example, a resonant cavity-type LED was fabricated. Also, a surface-emitting laser diode can be fabricated by further enhancing the reflectance of the DBRs on the surface side and by reducing the size of the emitting site.

What we claimed are:

1. A semiconductor light-emitting device comprising:
   a semiconductor substrate,
   at least first and second reflecting multilayers,
   a light-emitting layer, and
   wherein the first and second reflecting multilayers are formed on the semiconductor substrate by use of at least two material systems having a variable refractive index, and having a lattice constant similar to that of the semiconductor substrate, and each of the reflecting multilayers being formed by depositing alternatively two types of layers of the same material system; and
   wherein the light-emitting layer is formed on the plurality of reflecting multilayers so that both the first and second reflecting multilayers are on the same side of the light-emitting layer, wherein the light-emitting layer comprises one or more Layers including an active layer comprising the same material system as that of an uppermost of the reflecting multilayers, and wherein the uppermost reflecting multilayer is in contact with said light-emitting layer.

2. The semiconductor light-emitting device according to claim 1, further comprising a single reflecting multilayer formed on the light-emitting layer by use of a material system having a lattice constant similar to that of the light-emitting layer.

3. The semiconductor light-emitting device according to claim 2, wherein the single reflecting multilayer formed on and over the light-emitting layer comprises the same material system as that of the light-emitting layer.

4. The semiconductor light-emitting device according to claim 2, wherein one or more additional reflecting multilayers are further formed on the single reflecting multilayer formed on the light-emitting layer, by use of at least two material systems having a variable refractive index, and having a lattice constant similar to that of the semiconductor substrate, and each of the one or more additional reflecting multilayers is constituted by depositing alternatively two types of layers of the same material system.

5. The semiconductor light-emitting device according to claim 1, wherein first type of layers constituting the uppermost reflecting multilayer have a greater energy gap than that of second type of layers constituting the uppermost reflecting multilayer, wherein one of the first type of layers is in contact with the light-emitting layer.

6. The semiconductor light-emitting device according to claim 4, wherein the semiconductor substrate is made from GaAs.

7. The semiconductor light-emitting device according to claim 6, wherein the uppermost reflecting multilayer comprises $(Al_yGa_{1-y})_zIn_{1-z}P(0 \leq y \leq 1, 0 \leq z \leq 1)$; and the light-emitting layer comprises $(Al_{y'}Ga_{1-y'})_{z'}In_{1-z'}P(0 \leq y' \leq 1, 0 \leq z' \leq 1)$.

8. The semiconductor light-emitting device according to claim 7, wherein a bottom-most of the reflecting multilayers is in contact with the semiconductor substrate, and is formed on the semiconductor substrate and comprises $Al_xGa_{1-x}As$ $(0 \leq x \leq 1)$.

9. The semiconductor light-emitting device according to claim 7, wherein the one or more additional reflecting multilayers comprise $Al_xGa_{1-x}As(0 \leq x \leq 1)$.

10. The semiconductor light-emitting device according to claim 1, wherein a distance from a boundary to the active layer is 0.3 μm or longer, said boundary being:
    between the uppermost reflecting multilayer and a reflecting multilayer comprising a different material system from that of the uppermost multilayer, which is formed just below the uppermost reflecting multilayer; or
    when one or more reflecting multilayers comprising the same material system as that of the uppermost reflecting multilayer are consecutively formed just below the uppermost multilayer, between the lowermost reflecting multilayer of the one or more reflecting multilayer and a reflecting multilayer comprising a different material system from that of the uppermost multilayer, which is formed just below the lowermost reflecting multilayer.

11. The semiconductor light-emitting device according to claim 1, wherein the active layer is a quantum-well layer.

12. The semiconductor light-emitting device according to claim 2, wherein first type of layers constituting the single reflecting multilayer have a greater energy gap than that of second type of layers constituting the single reflecting multilayer, wherein one of the first type of layers is in contact with the light-emitting layer.

13. The semiconductor light-emitting device according to claim 1, wherein the semiconductor substrate is made from GaAs.

14. The semiconductor light-emitting device according to claim 13, wherein the uppermost reflecting multilayer comprises $(Al_yGa_{1-y})_zIn_{1-z}P(0 \leq y \leq 1, 0 \leq z \leq 1)$; and the light-emitting layer comprises $(Al_{y'}Ga_{1-y'})_{z'}In_{1-z'}P(0 \leq y' \leq 1, 0 \leq z' \leq 1)$.

15. The semiconductor light-emitting device according to claim 14, wherein a reflecting multilayer, in contact with the semiconductor substrate, of the plurality of reflecting multilayers formed on the semiconductor substrate comprises $Al_xGa_{1-x}As(0 \leq x \leq 1)$.

16. The semiconductor light-emitting device of claim 1, wherein a reflecting multilayer, in contact with the semiconductor substrate, of the plurality of reflecting multilayers formed on the semiconductor substrate comprises a first DBR (Distributed Bragg Reflector); and the uppermost reflecting multilayer comprises a different second DBR.

* * * * *